US009724783B2

(12) United States Patent
Odagiri et al.

(10) Patent No.: US 9,724,783 B2
(45) Date of Patent: Aug. 8, 2017

(54) LASER PROCESSING APPARATUS

(71) Applicant: DISCO CORPORATION, Tokyo (JP)

(72) Inventors: Wataru Odagiri, Tokyo (JP); Kouichi Nehashi, Tokyo (JP); Joel Koerwer, Tokyo (JP); Hironari Ohkubo, Tokyo (JP); Shuichiro Tsukiji, Tokyo (JP); Ryugo Oba, Tokyo (JP); Kentaro Odanaka, Tokyo (JP); Takashi Sampei, Tokyo (JP)

(73) Assignee: Disco Corporation, Tokyo (JP)

( * ) Notice: Subject to any disclaimer, the term of this patent is extended or adjusted under 35 U.S.C. 154(b) by 70 days.

(21) Appl. No.: 14/953,640

(22) Filed: Nov. 30, 2015

(65) Prior Publication Data

US 2016/0151857 A1 Jun. 2, 2016

(30) Foreign Application Priority Data

Dec. 1, 2014 (JP) .................. 2014-243305

(51) Int. Cl.
*B23K 26/00* (2014.01)
*B23K 26/06* (2014.01)
(Continued)

(52) U.S. Cl.
CPC ...... *B23K 26/0626* (2013.01); *B23K 26/0087* (2013.01); *B23K 26/032* (2013.01);
(Continued)

(58) Field of Classification Search
CPC .. B23K 26/0626; B23K 26/035; B23K 26/04; B23K 26/082; B23K 26/032; B23K 26/0853; B23K 26/359; B23K 26/0622; B23K 26/0087; B23K 2201/40; H01L 21/78; H01L 21/67092
(Continued)

(56) References Cited

U.S. PATENT DOCUMENTS

| 4,720,216 A * | 1/1988 | Smith ..................... B23B 27/10 407/11 |
| 5,300,134 A * | 4/1994 | Mannl ................... C03B 23/112 65/109 |

(Continued)

FOREIGN PATENT DOCUMENTS

JP 2006-253432 9/2006

*Primary Examiner* — Eric Stapleton
(74) *Attorney, Agent, or Firm* — Greer Burns & Crain Ltd.

(57) ABSTRACT

A laser beam irradiation unit of a laser processing apparatus includes a pulse laser oscillator, a condenser which converges and irradiates a pulse laser beam upon a workpiece held on a chuck table, a dichroic mirror disposed between the pulse laser oscillator and the condenser, a strobo flash irradiation unit which irradiates light on a route of the dichroic mirror and the condenser, a beam splitter disposed between the strobo flash irradiation unit and the dichroic mirror, and an image pickup unit disposed on the route of the light split by the beam splitter. A control unit renders the strobo flash irradiation unit and the image pickup unit operative in a timed relationship with the pulse laser beam oscillated from the pulse laser beam oscillator and irradiated upon the workpiece and detects a processed state on the basis of an image signal from the image pickup unit.

3 Claims, 8 Drawing Sheets

(51) Int. Cl.
  *B23K 26/035* (2014.01)
  *B23K 26/04* (2014.01)
  *B23K 26/082* (2014.01)
  *H01L 21/78* (2006.01)
  *B23K 26/03* (2006.01)
  *B23K 26/08* (2014.01)
  *B23K 26/359* (2014.01)
  *B23K 26/0622* (2014.01)
  *H01L 21/67* (2006.01)
  *B23K 101/40* (2006.01)

(52) U.S. Cl.
  CPC ............ *B23K 26/035* (2015.10); *B23K 26/04* (2013.01); *B23K 26/0622* (2015.10); *B23K 26/082* (2015.10); *B23K 26/0853* (2013.01); *B23K 26/359* (2015.10); *H01L 21/78* (2013.01); *B23K 2201/40* (2013.01); *H01L 21/67092* (2013.01)

(58) Field of Classification Search
  USPC .................. 219/121.61, 121.68, 121.81
  See application file for complete search history.

(56) References Cited

U.S. PATENT DOCUMENTS

| | | | | |
|---|---|---|---|---|
| 6,086,366 A * | 7/2000 | Mueller | ............... | A61C 1/0046 433/29 |
| 6,102,023 A * | 8/2000 | Ishiwata | ............... | B28D 5/024 125/13.01 |
| 6,341,740 B2 * | 1/2002 | Sekiya | ............... | B28D 5/0082 241/101.2 |
| 6,361,404 B1 * | 3/2002 | Ishiwata | ............... | B28D 5/024 125/20 |
| 6,494,122 B2 * | 12/2002 | Kamigaki | ............... | B23D 59/001 125/20 |
| 6,500,058 B2 * | 12/2002 | Bajo | ............... | B23Q 11/0053 451/361 |
| 6,606,985 B2 * | 8/2003 | Negishi | ............... | B27B 5/32 125/13.01 |
| 6,685,542 B2 * | 2/2004 | Mori | ............... | B24B 7/04 451/287 |
| 6,782,012 B2 * | 8/2004 | Karasaki | ............... | B23K 26/0643 372/10 |
| 6,844,963 B2 * | 1/2005 | Iketaki | ............... | G01J 3/4406 250/458.1 |
| 7,385,693 B2 * | 6/2008 | Namiki | ............... | G01J 3/02 356/328 |
| 7,443,517 B2 * | 10/2008 | Sawabe | ............... | B23K 26/048 250/559.27 |
| 7,471,384 B2 * | 12/2008 | Nomaru | ............... | B23K 26/03 356/241.1 |
| 7,521,337 B2 * | 4/2009 | Sekiya | ............... | B23K 26/0057 257/E21.211 |
| 7,630,421 B2 * | 12/2009 | Kobayashi | ............ | B23K 26/032 250/205 |
| 7,714,249 B2 * | 5/2010 | Nomaru | ............... | B23K 26/04 219/121.62 |
| 7,807,944 B2 * | 10/2010 | Akasaka | ............... | B23K 26/032 219/121.7 |
| 7,936,804 B2 * | 5/2011 | Iwashiro | ............... | H01S 3/08 372/101 |
| 7,998,840 B2 * | 8/2011 | Watanabe | ............ | B23K 26/046 257/E21.238 |
| 8,487,208 B2 * | 7/2013 | Kobayashi | ......... | B23K 26/0853 219/121.61 |
| 2001/0040197 A1 * | 11/2001 | Sekiya | ............... | B28D 5/0082 241/101.4 |
| 2001/0045529 A1 * | 11/2001 | Iketaki | ............... | G01J 3/4406 250/493.1 |
| 2002/0018495 A1 * | 2/2002 | Karasaki | ............ | B23K 26/0643 372/10 |
| 2002/0025616 A1 * | 2/2002 | Kamigaki | ............ | B23D 59/001 438/200 |
| 2002/0037692 A1 * | 3/2002 | Bajo | ............... | B23Q 11/0053 451/361 |
| 2002/0081954 A1 * | 6/2002 | Mori | ............... | B24B 7/04 451/65 |
| 2002/0104422 A1 * | 8/2002 | Negishi | ............... | B27B 5/32 83/864 |
| 2004/0011176 A1 * | 1/2004 | Sekiya | ............... | B28D 5/0058 83/401 |
| 2005/0232316 A1 * | 10/2005 | Akasaka | ............... | B23K 26/032 372/25 |
| 2007/0046946 A1 * | 3/2007 | Namiki | ............... | G01J 3/02 356/456 |
| 2007/0119835 A1 * | 5/2007 | Nomaru | ............... | B23K 26/04 219/121.73 |
| 2008/0007737 A1 * | 1/2008 | Sekiya | ............... | B23K 26/0057 356/614 |
| 2008/0031291 A1 * | 2/2008 | Kobayashi | ............ | B23K 26/032 372/29.012 |
| 2008/0037596 A1 * | 2/2008 | Kobayashi | ......... | B23K 26/0853 372/9 |
| 2008/0055588 A1 * | 3/2008 | Nomaru | ............... | B23K 26/03 356/73 |
| 2008/0180697 A1 * | 7/2008 | Sawabe | ............... | B23K 26/048 356/630 |
| 2009/0291544 A1 * | 11/2009 | Watanabe | ............ | B23K 26/046 438/463 |
| 2010/0074296 A1 * | 3/2010 | Iwashiro | ............... | H01S 3/08 372/99 |
| 2013/0344629 A1 * | 12/2013 | Baek | ............... | H01L 21/67092 438/16 |

\* cited by examiner

LASER PROCESSING APPARATUS

BACKGROUND OF THE INVENTION

Field of the Invention

The present invention relates to a laser processing apparatus which performs laser processing for a workpiece such as a semiconductor wafer held on a chuck table.

Description of the Related Art

In a semiconductor device fabrication process, a plurality of regions are partitioned by scheduled division lines arrayed in a grating on a front face of a semiconductor wafer having a substantially circular disk shape, and a device such as an IC or an LSI is formed in each of the partitioned regions. Then, by cutting the semiconductor wafer along the scheduled division lines, the regions in each of which a device is formed are separated from each other to fabricate individual semiconductor chips. As a method for dividing a wafer such as a semiconductor wafer along scheduled division lines, a technique has been put into practical use which performs ablation processing by irradiating a pulse laser beam of a wavelength having an absorbency to a wafer along scheduled division lines to form laser processed grooves and applying external force along the scheduled division lines along which the laser processed grooves, each of which serves as a start point of break, are formed to break the wafer.

A laser processing apparatus which performs the laser processing described above includes workpiece holding means for holding a workpiece, laser beam irradiation means for irradiating a laser beam upon the workpiece held by the workpiece holding means, moving means for moving the workpiece holding means and the laser beam irradiation means relative to each other, and alignment means for detecting a region to be processed of the workpiece held by the workpiece holding means (refer to, for example, Japanese Patent Laid-Open No. 2006-253432).

SUMMARY OF THE INVENTION

However, the laser processing apparatus described above has a problem in that, if the output power of the laser beam to be irradiated by the laser beam irradiation means varies or an optical system suffers from distortion, then desired processing cannot be performed in that processing is performed but insufficiently or the focused spot of the laser beam cannot be positioned at the position for processing.

Therefore, it is an object of the present invention to provide a laser processing apparatus which can monitor the variation of the output power of a laser beam irradiated by laser beam irradiation means or the irradiation position of the laser beam.

In accordance with an aspect of the present invention, there is provided a laser processing apparatus including a chuck table configured to hold a workpiece thereon, laser beam irradiation means for irradiating a pulse laser beam upon the workpiece held on the chuck table, X-axis direction moving means for moving the chuck table and the laser beam irradiation means relative to each other in an X-axis direction, Y-axis direction moving means for moving the chuck table and the laser beam irradiation means relative to each other in a Y-axis direction perpendicular to the X-axis direction, and control means for controlling the laser beam irradiation means, the X-axis direction moving means and the Y-axis direction moving means. The laser beam irradiation means includes pulse laser beam oscillation means for oscillating a pulse laser beam, a condenser configured to converge the pulse laser beam oscillated from the pulse laser beam oscillation means and irradiate the pulse laser beam upon the workpiece held on the chuck table, a dichroic mirror disposed between the pulse laser beam oscillation means and the condenser and configured to reflect the pulse laser beam oscillated from the pulse laser beam oscillation means to introduce the pulse laser beam to the condenser while allowing light of wavelengths other than a wavelength of the pulse laser beam to pass therethrough, strobo flash irradiation means for irradiating strobo flash upon a route of the dichroic mirror and the condenser, a beam splitter disposed between the strobo flash irradiation means and the dichroic mirror and configured to split light from the workpiece held on the chuck table, and image pickup means disposed on the route split by the beam splitter. The control means renders the strobo flash irradiation means and the image pickup means operative in accordance with a timing of the pulse laser beam oscillated by the pulse laser beam oscillation means and irradiated upon the workpiece held on the chuck table to detect a processed state on the basis of an image signal from the image pickup means.

Preferably, the strobo flash irradiation means includes a strobo flash source configured to emit light, an iris configured to define a field size of the light emitted from the strobo flash source, and a lens configured to converge the light having passed through the iris upon the workpiece held on the chuck table, and the image pickup means includes a lens set configured from an aberration correction lens and an image forming lens, and an image pickup element configured to pick up an image captured by the lens set.

Preferably, the control means detects a displacement between an irradiation position of the pulse laser beam irradiated from the laser beam irradiation means and a set processing position on the basis of an image signal from the image pickup means and controls, when the displacement amount exceeds a permissible value set in advance, the X-axis direction moving means or the Y-axis direction moving means so as to correct the displacement.

In the laser processing apparatus of the present invention, the control means renders the strobo flash irradiation means and the image pickup means operative in a timed relationship with the pulse laser beam oscillated by the pulse laser beam oscillation means and irradiated upon the workpiece held on the chuck table to detect a processed state on the basis of an image signal from the image pickup means. Therefore, if the output power of the pulse laser beam varies or the spot of the pulse laser beam comes to fail to be irradiated at the set processing position, then the processing situation can be detected on the real time basis to carry out necessary correction.

The above and other objects, features and advantages of the present invention and the manner of realizing them will become more apparent, and the invention itself will best be understood from a study of the following description and the appended claims with reference to the attached drawings showing a preferred embodiment of the invention.

DETAILED DESCRIPTION OF THE PREFERRED EMBODIMENT

Figure 1:
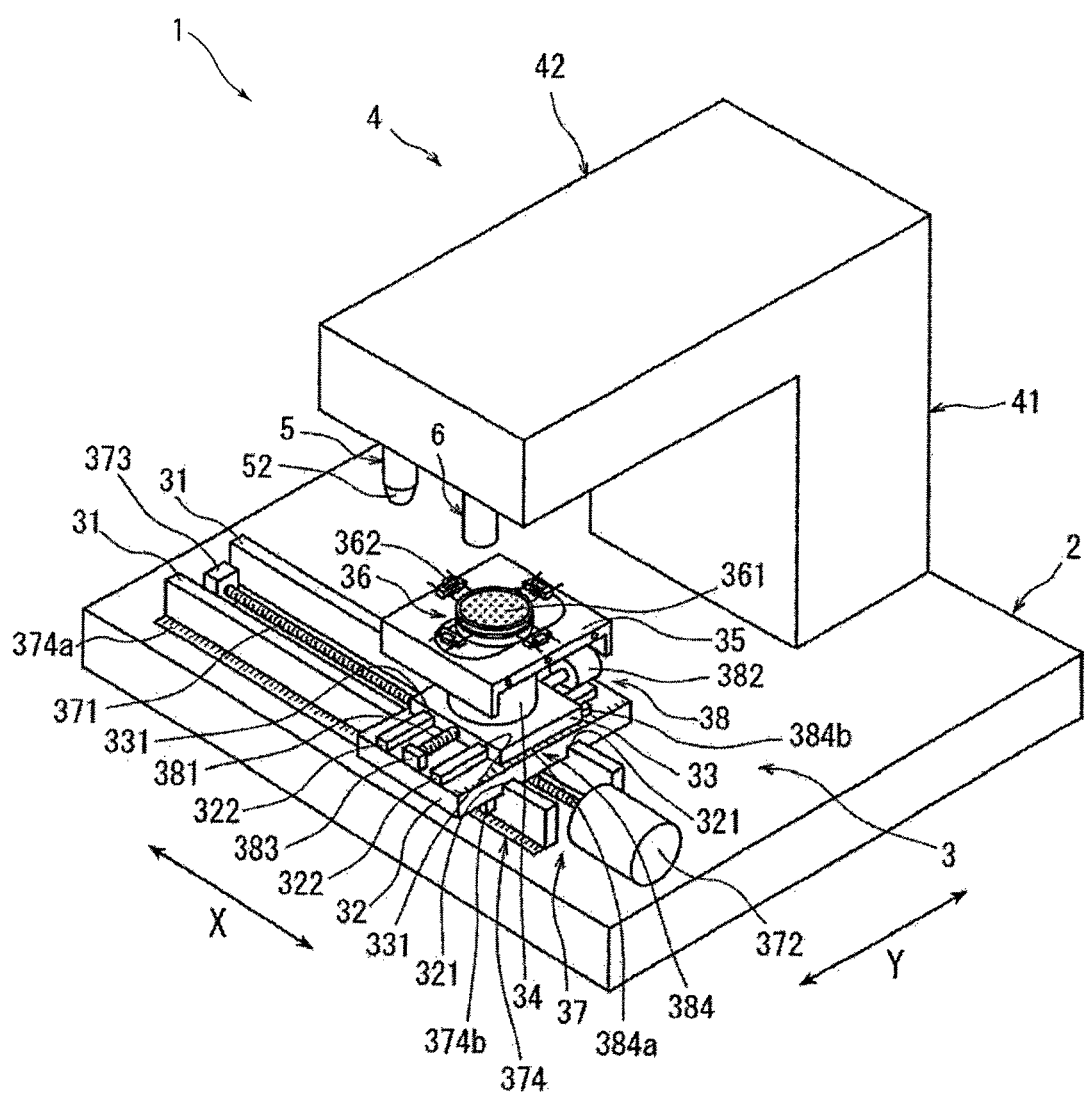
FIG. 1 is a perspective view of a laser processing apparatus according to an embodiment of the present invention.

In the following, a preferred embodiment of a laser processing apparatus 1 configured in accordance with the present invention is described in detail with reference to the accompanying drawings. FIG. 1 depicts a perspective view of the laser processing apparatus 1 configured in accordance with the present invention. The laser processing apparatus 1 depicted in FIG. 1 includes a stationary base 2, a chuck table mechanism 3 disposed for movement in an X-axis direction, which is a processing feeding direction, indicated by an arrow mark X on the stationary base 2 and configured to hold a workpiece thereon, and a laser beam irradiation unit 4 as laser beam irradiation means disposed on the stationary base 2.

The chuck table mechanism 3 includes a pair of guide rails 31 disposed in parallel along the X-axis direction on the stationary base 2, a first sliding block 32 disposed for movement in the X-axis direction on the guide rails 31, a second sliding block 33 disposed for movement in a Y-axis direction, which is an indexing direction, indicated by an arrow mark Y orthogonal to the X-axis direction on the first sliding block 32, a support table 35 supported by a cylindrical member 34 on the second sliding block 33, and a chuck table 36 as workpiece holding means. The chuck table 36 includes an absorption chuck 361 configured from a porous material, and, for example, a circular semiconductor wafer which is a workpiece is held by suction means not depicted on a holding face which is an upper face of the absorption chuck 361. The chuck table 36 configured in such a manner as just described is rotated by a stepping motor not depicted disposed in the cylindrical member 34. It is to be noted that a clamp 362 for fixing an annular frame for supporting a workpiece such as a semiconductor wafer through a protective tape is disposed on the chuck table 36.

The first sliding block 32 includes a pair of guiding target grooves 321 provided on the lower face thereof for fitting with the pair of guide rails 31 and a pair of guide rails 322 formed in parallel along the Y-axis direction and provided on the upper face thereof. The first sliding block 32 configured in such a manner as just described is configured for movement in the X-axis direction along the pair of guide rails 31 by fitting the guiding target grooves 321 with the pair of guide rails 31. The chuck table mechanism 3 includes X-axis direction moving means 37 for moving the first sliding block 32 in the X-axis direction along the pair of guide rails 31. The X-axis direction moving means 37 includes an external thread rod 371 disposed in parallel to and between the pair of guide rails 31 and a driving source such as a stepping motor 372 for driving the external thread rod 371 to rotate. The external thread rod 371 is supported at one end thereof for rotation on a bearing block 373 fixed to the stationary base 2 and transmission-coupled at the other end thereof to an output power shaft of the stepping motor 372. It is to be noted that the external thread rod 371 is screwed into a penetrating internal thread hole formed on an internal thread block not depicted provided in a projecting manner on the lower face of a central portion of the first sliding block 32. Accordingly, by driving the external thread rod 371 for forward rotation and reverse rotation by the stepping motor 372, the first sliding block 32 is moved in the X-axis direction along the guide rails 31.

The laser processing apparatus 1 includes X-axis direction position detection means 374 for detecting an X-axis direction position of the chuck table 36. The X-axis direction position detection means 374 is configured from a linear scale 374a disposed along the guide rails 31, and a reading head 374b disposed on the first sliding block 32 and movable along the linear scale 374a together with the first sliding block 32. The reading head 374b of the X-axis direction position detection means 374 sends a pulse signal, in the present embodiment, of one pulse after every 1 μm to control means hereinafter described. Then, the control means hereinafter described counts the pulse signal inputted thereto to detect the X-axis direction position of the chuck table 36. It is to be noted that, where the stepping motor 372 is used as a driving source for the X-axis direction moving means 37, also it is possible to detect the X-axis direction position of the chuck table 36 by counting driving pulses of the control means hereinafter described which outputs a driving signal to the stepping motor 372. On the other hand, where a servomotor is used as the driving source for the X-axis direction moving means 37, also it is possible to send a pulse signal outputted from a rotary encoder for detecting the number of rotations of the servomotor to the control means hereinafter described so that the control means counts the inputted pulse signal to detect the X-axis direction position of the chuck table 36.

The second sliding block 33 includes a pair of guiding target grooves 331 provided on the lower face thereof for fitting with the pair of guide rails 322 provided on the upper face of the first sliding block 32, and is configured for movement in the Y-axis direction by fitting the guiding target grooves 331 with the pair of guide rails 322. The chuck table mechanism 3 includes Y-axis direction moving means 38 for moving the second sliding block 33 in the Y-axis direction along the pair of guide rails 322 provided on the first sliding block 32. The Y-axis direction moving means 38 includes an external thread rod 381 disposed in parallel to and between the pair of guide rails 322 and a driving source such as a stepping motor 382 for driving the external thread rod 381 to rotate. The external thread rod 381 is supported at one end thereof for rotation on a bearing block 383 fixed to the upper face of the first sliding block 32 and transmission-coupled at the other end thereof to an output power shaft of the stepping motor 382. It is to be noted that the external thread rod 381 is screwed in a penetrating internal thread hole formed on an internal thread block not depicted provided in a projecting manner on the lower face of a central portion of the second sliding block 33. Accordingly, by driving the external thread rod 381 for forward rotation and reverse rotation by the stepping motor 382, the second sliding block 33 is moved in the Y-axis direction along the guide rails 322.

The laser processing apparatus 1 includes Y-axis direction position detection means 384 for detecting the Y-axis direction position of the second sliding block 33. The Y-axis direction position detection means 384 is configured from a linear scale 384a disposed along the guide rails 322, and a reading head 384b disposed on the second sliding block 33 and movable along the linear scale 384a together with the second sliding block 33. The reading head 384b of the Y-axis direction position detection means 384 sends a pulse signal, in the present embodiment, of one pulse after every 1 μm to control means hereinafter described. Thus, the control means hereinafter described detects the Y-axis direction position of the chuck table 36 by counting the pulse signal inputted thereto. It is to be noted that, where the stepping motor 382 is used as the driving source for the Y-axis direction moving means 38, it is possible to detect the Y-axis direction position of the chuck table 36 by counting the driving pulse of the control means hereinafter described which outputs a driving signal to the stepping motor 382. On the other hand, where a servomotor is used as the driving source for the Y-axis direction moving means 38, also it is possible to send a pulse signal outputted from a rotary encoder for detecting the number of rotations of the servomotor to the control means hereinafter described such that the control means can detect the Y-axis direction position of the chuck table 36 by counting the pulse signal inputted thereto.

The laser beam irradiation unit 4 includes a support member 41 disposed on the stationary base 2, a casing 42 supported by the support member 41 and extending substantially in a horizontal direction, laser beam irradiation means 5 disposed on the casing 42, and alignment means 6 disposed at a front end portion of the casing 42 for detecting a processing region for which laser processing is to be performed. It is to be noted that the alignment means 6 includes illumination means for illuminating a workpiece, an optical system for capturing a region illuminated by the illumination means, an image pickup device (CCD) for picking up an image captured by the optical system, and so forth. An image signal obtained by the image pickup is sent to the control means hereinafter described.

Figure 2:
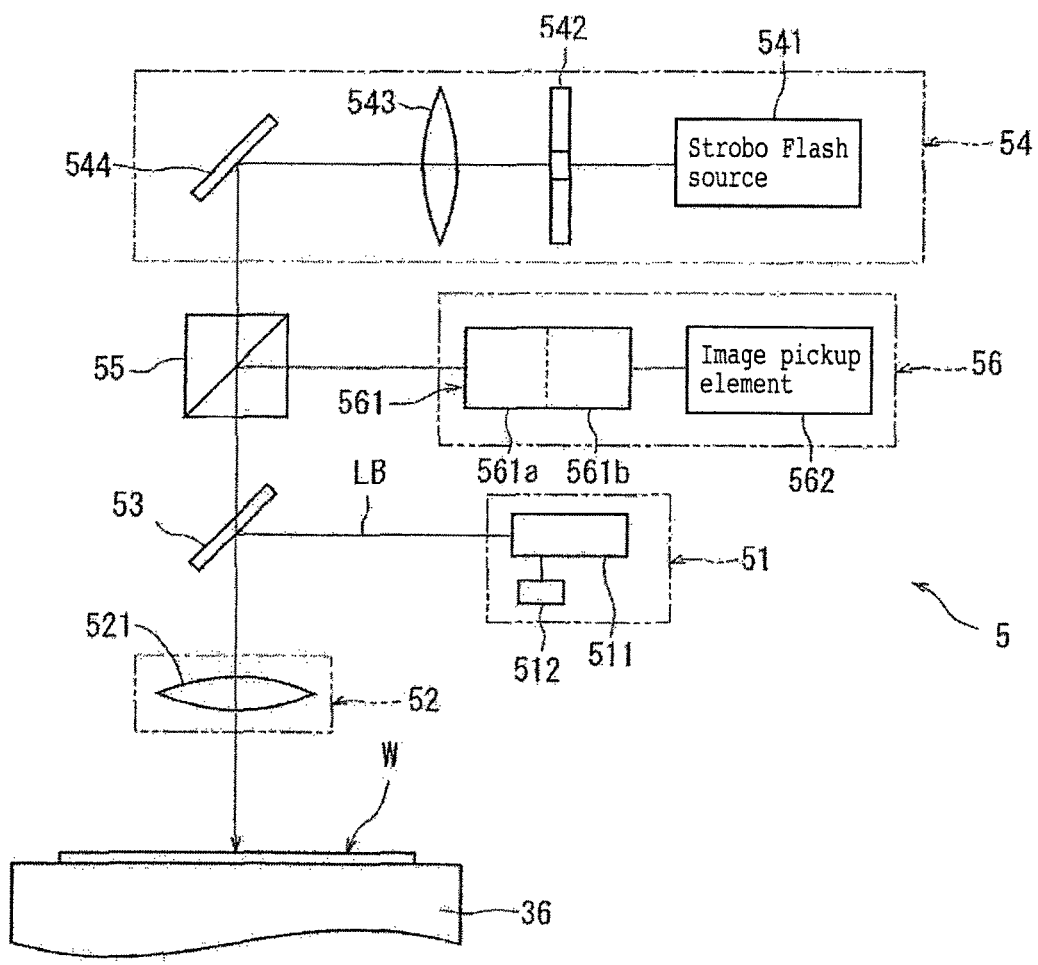
FIG. 2 is a block diagram of laser beam irradiation means provided in the laser processing apparatus depicted in FIG. 1.

The laser beam irradiation means 5 described above is described with reference to FIG. 2. The laser beam irradiation means 5 includes pulse laser oscillation means 51, a condenser 52, and a dichroic mirror 53. The condenser 52 converges a pulse laser beam oscillated from the pulse laser beam oscillation means 51 and irradiates the pulse laser beam upon a workpiece W held on the chuck table 36. The dichroic mirror 53 is disposed between the pulse laser beam oscillation means 51 and the condenser 52 to introduce the pulse laser beam oscillated from the pulse laser beam oscillation means 51 to the condenser 52. The pulse laser beam oscillation means 51 is configured from a pulse laser oscillator 511 and a repetition frequency setting means 512 provided for the pulse laser oscillator 511. It is to be noted that the pulse laser oscillator 511 of the pulse laser beam oscillation means 51 oscillates a pulse laser beam LB, in the present embodiment, of a wavelength of 355 nm. The condenser 52 includes a condenser lens 521 for converging the pulse laser beam LB oscillated from the pulse laser beam oscillation means 51. The dichroic mirror 53 disposed between the pulse laser beam oscillation means 51 and the condenser 52 has a function for reflecting and introducing the pulse laser beam LB oscillated from the pulse laser beam oscillation means 51 to the condenser 52 and allowing light of wavelengths other than the wavelength of the pulse laser beam LB (in the present embodiment, 355 nm) to pass therethrough.

The laser beam irradiation means 5 includes strobo flash irradiation means 54 for irradiating strobo flash on a route of the dichroic mirror 53 and the condenser 52, a beam splitter 55 disposed between the strobo flash irradiation means 54 and the dichroic mirror 53 for splitting light from a workpiece W held on the chuck table 36, and image pickup means 56 disposed on the route split by the beam splitter 55. The strobo flash irradiation means 54 is configured from a strobo flash source 541 formed from a xenon flash lamp for emitting white light, a iris 542 for defining a field size of the white light emitted from the strobo flash source 541, a lens 543 for converging the white light having passed through the iris 542 on the workpiece W held on the chuck table 36, and a direction conversion mirror 544 for converting the direction of the white light converged by the lens 543 toward the beam splitter 55.

The beam splitter 55 introduces the white light introduced by the direction conversion mirror 544 of the strobo flash irradiation means 54 toward the dichroic mirror 53 and splits the light from the workpiece W held on the chuck table 36 toward the image pickup means 56. The image pickup means 56 is configured from a lens set 561 including an aberration correction lens 561a and an image forming lens 561b, and an image pickup element (CCD) 562 for picking up an image captured by the lens set 561. An image signal obtained by the image pickup is sent to the control means hereinafter described.

Figure 3:
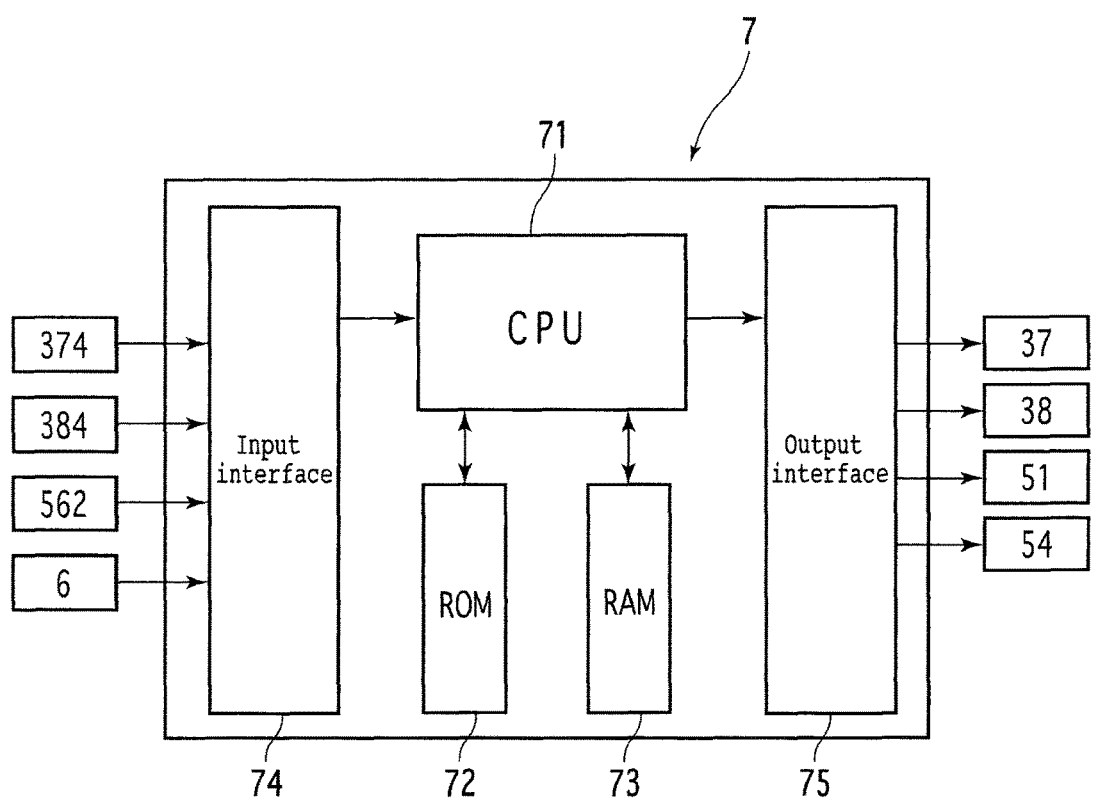
FIG. 3 is a block diagram of control means provided in the laser processing apparatus depicted in FIG. 1.

The laser processing apparatus 1 includes control means 7 depicted in FIG. 3. The control means 7 is configured from a computer and includes a central processing unit (CPU) 71 which carries out arithmetic operation processing in accordance with a control program, a read only memory (ROM) 72 for storing the control program and so forth, a readable and writable random access memory (RAM) 73 for storing a result of arithmetic operation processing and so forth, an input interface 74, and an output interface 75. To the input interface 74 of the control means 7, detection signals from the X-axis direction position detection means 374, Y-axis direction position detection means 384, image pickup element (CCD) 562 of the image pickup means 56, alignment means 6 and so forth are inputted. Further, from the output interface 75 of the control means 7, control signals are outputted to the X-axis direction moving means 37, Y-axis direction moving means 38, pulse laser beam oscillation means 51 and strobo flash irradiation means 54 of the laser beam irradiation means 5 and so forth.

Figure 4:
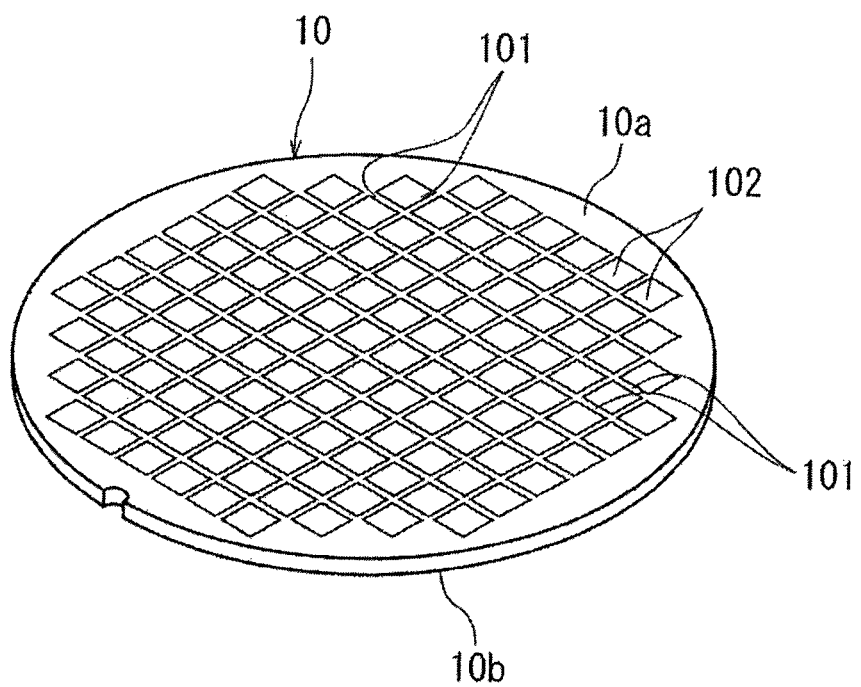
FIG. 4 is a perspective view of a semiconductor wafer as a workpiece.

The laser processing apparatus 1 is configured in such a manner as described above, and in the following, action of the laser processing apparatus 1 is described. FIG. 4 depicts a perspective view of a semiconductor wafer 10 as a workpiece to be processed by the laser processing apparatus described hereinabove. The semiconductor wafer 10 depicted in FIG. 4 is a silicon wafer, and has a plurality of scheduled division lines 101 formed in a grating on a front face 10a thereof and has devices 102 such as ICs or LSIs in a plurality of regions partitioned by the scheduled division lines 101.

Figure 5:
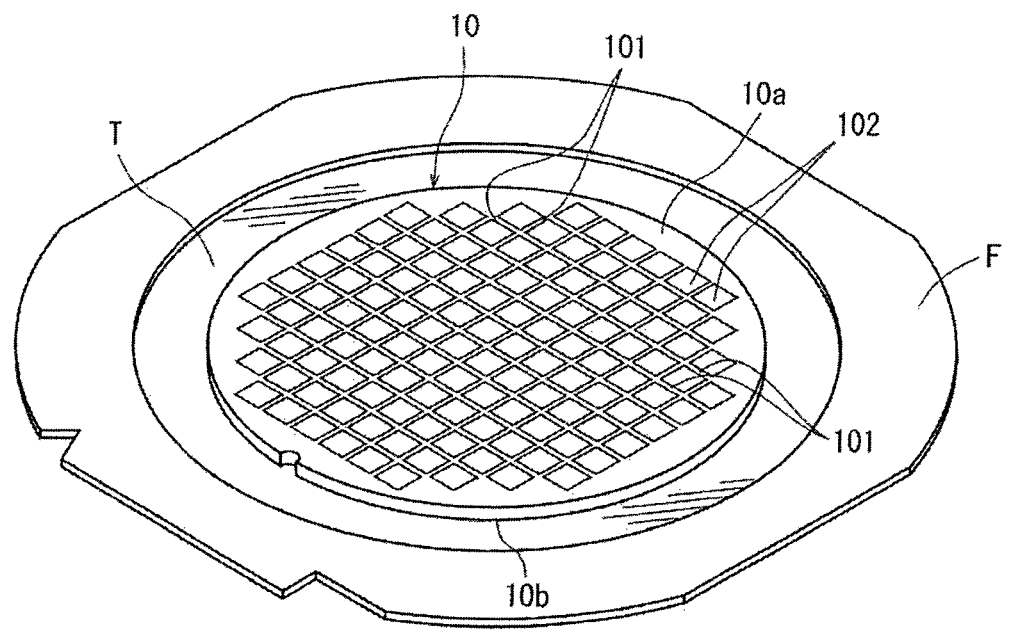
FIG. 5 is a perspective view depicting the semiconductor wafer depicted in FIG. 4 but in a state in which the semiconductor wafer is pasted to a front face of a dicing tape mounted on an annular frame.

In order to divide the semiconductor wafer 10 described above along the scheduled division lines 101, a workpiece supporting step is carried out first for pasting an adhesive tape made of a synthetic resin at a front face thereof to a rear face 10b of the semiconductor wafer 10 and supporting the adhesive tape at an outer peripheral portion thereof by an annular frame. In particular, as depicted in FIG. 5, the semiconductor wafer 10 is pasted at the rear face 10b thereof to a front face of an adhesive tape T which is mounted at an outer peripheral portion thereof so as to cover an inner side opening of an annular frame F. It is to be noted that the adhesive tape T is formed, in the present embodiment, from a polyvinyl chloride (PVC) sheet.

After the workpiece supporting step described above is carried out, the semiconductor wafer 10 is placed at the adhesive tape T side thereof on the chuck table 36 of the laser processing apparatus 1 depicted in FIG. 1. Then, the suction means not depicted is rendered operative to suck and hold the semiconductor wafer 10 to and on the chuck table 36 with the adhesive tape T interposed therebetween (workpiece holding step). It is to be noted that the annular frame F on which the semiconductor wafer 10 is supported with the adhesive tape T interposed therebetween is fixed by the clamp 362 disposed on the chuck table 36.

After the workpiece holding step is carried out, the X-axis direction moving means 37 is rendered operative to position the chuck table 36, to and on which the semiconductor wafer 10 is sucked and held, just below the alignment means 6. After the chuck table 36 is positioned just below the alignment means 6, an alignment process for detecting a processing region of the semiconductor wafer 10 to be laser-processed is executed by the alignment means 6 and the control means 7. In particular, the alignment means 6 and the control means 7 execute an image process such as pattern matching for carrying out positioning of a scheduled division line 101 formed in a predetermined direction of the semiconductor wafer 10 with respect to the condenser 52 of the laser beam irradiation means 5 for irradiating a laser beam to establish alignment of the laser beam irradiation position. Further, alignment of the laser beam irradiation position is performed similarly also with respect to a scheduled division line 101 formed in a direction orthogonal to the predetermined direction on the semiconductor wafer 10.

Figure 6A:
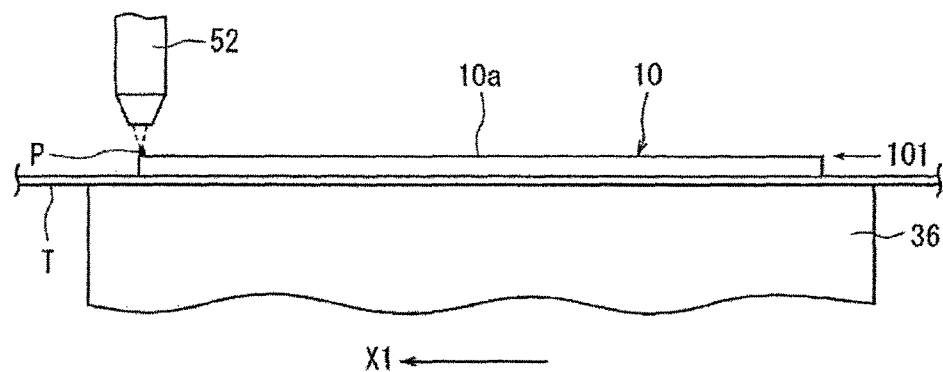
FIGS. 6A to 6C are schematic views illustrating a laser processing step performed by the laser processing apparatus depicted in FIG. 1.
Figure 6B:
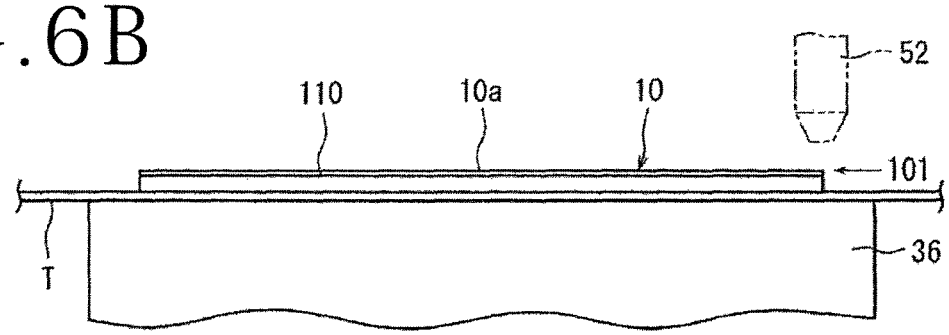
Figure 6C:
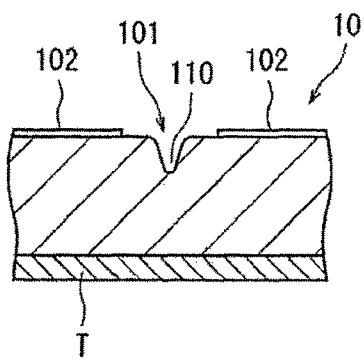

After the scheduled division lines 101 formed on the semiconductor wafer 10 held on the chuck table 36 are detected and the alignment of the laser beam irradiation position is carried out in such a manner as described above, the chuck table 36 is moved to the laser beam irradiation region in which the condenser 52 of the laser beam irradiation means 5 is positioned to position one end (left end in FIG. 6A) of a predetermined scheduled division line 101 just below the condenser 52 as depicted in FIG. 6A. Then, the focused point P of the pulse laser beam irradiated from the condenser 52 is positioned in the proximity of the front face (upper face) of the semiconductor wafer 10. Then, a pulse laser beam of a wavelength having an absorbency to the semiconductor wafer 10 (in the present embodiment, 355 nm) is irradiated from the condenser 52 of the laser beam irradiation means 5 while the chuck table 36 is moved at a predetermined moving speed in a direction indicated by an arrow mark X1 in FIG. 6A. Then, after the other end (right end in FIG. 6B) of the scheduled division line 101 comes to the position just below the condenser 52, then the irradiation of the pulse laser beam is stopped and the movement of the chuck table 36 is stopped. As a result, on the semiconductor wafer 10, a laser processed groove 110 is formed along the scheduled division line 101 as depicted in FIGS. 6B and 6C (laser processing step).

The laser processing step is carried out in accordance with the following processing conditions.

Light source of laser beam: YVO4 pulse laser or YAG pulse laser
  Wavelength: 355 nm
  Repetition frequency: 50 kHz
  Average output power: 3 W
  Focused spot diameter: 10 μm
  Processing feeding speed: 100 mm/second If some distortion occurs with the optical system from the pulse laser beam oscillation means 51 to the condenser 52 of the laser beam irradiation means 5 while the laser processing step described above is being carried out, then this gives rise to a problem that the laser processing becomes insufficient or the focused spot of the pulse laser beam cannot be positioned to the processing position, resulting in failure to carry out desired laser processing for the semiconductor wafer 10 as the workpiece. Therefore, in the laser processing apparatus 1 in the present embodiment, the irradiation position of the pulse laser beam irradiated from the condenser 52 of the laser beam irradiation means 5 is monitored. In particular, the strobo flash irradiation means 54 is rendered operative in accordance with an irradiation timing of the pulse laser beam oscillated from the pulse laser beam oscillation means 51 of the laser beam irradiation means 5 and irradiated upon the semiconductor wafer 10 held on the chuck table 36 from the condenser 52 to irradiate white light upon the pulse laser beam irradiation region of the semiconductor wafer 10. Then, the light from the semiconductor wafer 10 is picked up as an image by the image pickup means 56, and an image signal obtained by the image pickup is fed to the control means 7. Consequently, the control means 7 detects a displacement (processed state) between the position at which the pulse laser beam is irradiated and the position for processing on the basis of the image signal sent thereto from the image pickup element (CCD) 562 of the image pickup means 56 (laser beam irradiation position monitoring step).

Figure 7:
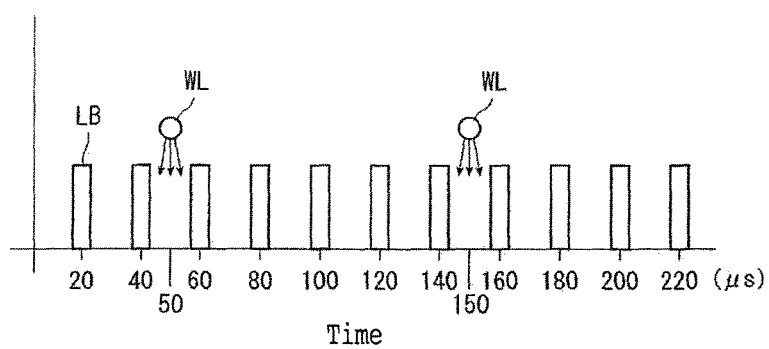
FIG. 7 is a diagrammatic view illustrating timings of a pulse laser beam irradiated by the laser beam irradiation means and light irradiated by strobo flash irradiation means.

The laser beam irradiation position monitoring step is described in more detail with reference to FIG. 7. In the present embodiment, since the repetition frequency of the pulse laser beam oscillated from the pulse laser beam oscillation means 51 of the laser beam irradiation means 5 is 50 kHz, the pulse laser beam LB of one pulse is irradiated after every 20 microseconds upon the semiconductor wafer 10 held on the chuck table 36. In order to detect the irradiation position of the pulse laser beam irradiated on the semiconductor wafer 10 held on the chuck table 36 in this manner, the control means 7 renders the strobo flash source 541 of the strobo flash irradiation means 54 operative. The timing at which the strobo flash source 541 is to be rendered operative is determined such that the light emitted therefrom is irradiated between a pulse laser beam LB and another pulse laser beam LB so that it does not overlap with the pulse laser beams LB. In particular, in the present embodiment, the strobo flash source 541 is set such that it is rendered operative first at the time of 50 microseconds after starting of oscillation of the pulse laser beam and is thereafter rendered operative after every 100 microseconds so that the while light WL is irradiated upon the semiconductor wafer 10 held on the chuck table 36. Accordingly, light from a region processed by the pulse laser beam irradiated on the semiconductor wafer 10 held on the chuck table 36 immediately before the while light WL is irradiated (10 microseconds ago) is introduced to the image pickup means 56 through the condenser lens 521, dichroic mirror 53 and beam splitter 55.

Figure 8:
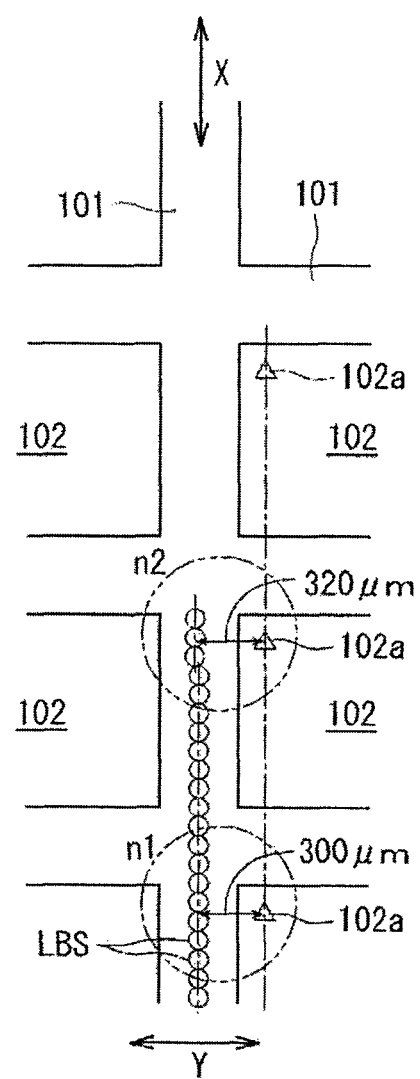
FIG. 8 is a schematic view of a laser beam irradiation position monitoring step performed by the laser processing apparatus depicted in FIG. 1.

The light introduced to the image pickup means 56 passes through the lens set 561 formed from the aberration correction lens 561*a* and the image forming lens 561*b* and forms an image on the image pickup element (CCD) 562. Then, the image pickup element (CCD) 562 sends an image signal of the formed image to the control means 7. The image signal sent after every 100 microseconds from the image pickup element (CCD) 562 in this manner is stored into the random access memory (RAM) 73 by the control means 7. FIG. 8 depicts spots LBS of the pulse laser beam irradiated along a scheduled division line 101 of the semiconductor wafer 10 held on the chuck table 36 and a first picked up image n1 and a second picked up image n2 sent from the image pickup element (CCD) 562. In the embodiment depicted in FIG. 8, a target 102a is set at a predetermined position of each of the devices 102 formed on the semiconductor wafer 10, and the Y-axis direction distance from the target 102a to the center (processing position) of an adjacent scheduled division line 101 is set, for example, to 300 µm.

In the embodiment depicted in FIG. 8, while the Y-axis direction distance from the target 102a of the first picked up image n1 to the spot LBS of the irradiated pulse laser beam is 300 µm, the Y-axis direction distance from the target 102a of the second picked up image n2 to the spot LBS of the irradiated pulse laser beam is 320 µm. Therefore, it is detected that the spot LBS is displaced by 20 µm from the center of the scheduled division line 101 (processing position). Where the position of the spot LBS of the pulse laser beam irradiated along a scheduled division line 101 of the semiconductor wafer 10 held on the chuck table 36 is displaced from a predetermined processing position in this manner, if the displacement amount exceeds a permissible value (for example, 10 µm), then the control means 7 controls the Y-axis direction moving means 38 to correct the irradiation position of the pulse laser beam to be irradiated from the condenser 52 of the laser beam irradiation means 5. At this time, the control means 7 controls the Y-axis direction moving means 38 on the basis of a detection signal from the Y-axis direction position detection means 384.

It is to be noted that, while the embodiment described above is directed to an example wherein the displacement of the irradiation position of the pulse laser beam to be irradiated from the condenser 52 of the laser beam irradiation means 5 is detected and used for correction, the control means 7 can detect the shape and the size of the spot LBS of the pulse laser beam on the basis of an image signal sent from the image pickup element (CCD) 562 of the image pickup means 56. Thus, the output power of the pulse laser beam can be corrected on the basis of a processed state such as the shape and the size of the spot LBS of the pulse laser beam.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus, comprising:
a chuck table configured to hold a workpiece thereon;
laser beam irradiation means for irradiating a pulse laser beam upon the workpiece held on the chuck table;
X-axis direction moving means for moving the chuck table and the laser beam irradiation means relative to each other in an X-axis direction;
Y-axis direction moving means for moving the chuck table and the laser beam irradiation means relative to each other in a Y-axis direction perpendicular to the X-axis direction; and
control means for controlling the laser beam irradiation means, the X-axis direction moving means and the Y-axis direction moving means;
the laser beam irradiation means including
pulse laser beam oscillation means for oscillating a pulse laser beam,
a condenser configured to converge the pulse laser beam oscillated from the pulse laser beam oscillation means and irradiate the pulse laser beam upon the workpiece held on the chuck table,
a dichroic mirror disposed between the pulse laser beam oscillation means and the condenser and configured to reflect the pulse laser beam oscillated from the pulse laser beam oscillation means to introduce the pulse laser beam to the condenser while allowing light of wavelengths other than a wavelength of the pulse laser beam to pass therethrough,
strobo flash irradiation means for irradiating strobo flash upon a route of the dichroic mirror and the condenser,
a beam splitter disposed between the strobo flash irradiation means and the dichroic mirror and configured to split light from the workpiece held on the chuck table, and
image pickup means disposed on the route split by the beam splitter;
the control means rendering the strobo flash irradiation means and the image pickup means operative in accordance with a timing of the pulse laser beam oscillated by the pulse laser beam oscillation means and irradiated upon the workpiece held on the chuck table to detect a processed state on the basis of an image signal from the image pickup means.

2. The laser processing apparatus according to claim 1, wherein the strobo flash irradiation means includes a strobo flash source configured to emit light, an iris configured to define a field size of the light emitted from the strobo flash source, and a lens configured to converge the light having passed through the iris upon the workpiece held on the chuck table, and
the image pickup means includes a lens set configured from an aberration correction lens and an image forming lens, and an image pickup element configured to pick up an image captured by the lens set.

3. The laser processing apparatus according to claim 1, wherein the control means detects a displacement between an irradiation position of the pulse laser beam irradiated from the laser beam irradiation means and a set processing position on the basis of an image signal from the image pickup means and controls, when the displacement amount exceeds a permissible value set in advance, the X-axis direction moving means or the Y-axis direction moving means so as to correct the displacement.

* * * * *